(12) United States Patent
Muenzberg

(10) Patent No.: US 7,238,891 B2
(45) Date of Patent: Jul. 3, 2007

(54) CIRCUIT BOARD WITH AT LEAST ONE RIGID AND AT LEAST ONE FLEXIBLE AREA AND PROCESS FOR PRODUCING RIGID-FLEXIBLE CIRCUIT BOARDS

(75) Inventor: Roland Muenzberg, Kirchhain (DE)

(73) Assignee: Ruwel AG, Wetter/Hessen (DE)

( * ) Notice: Subject to any disclaimer, the term of this patent is extended or adjusted under 35 U.S.C. 154(b) by 106 days.

(21) Appl. No.: 10/528,648

(22) PCT Filed: Sep. 19, 2003

(86) PCT No.: PCT/EP03/10438

§ 371 (c)(1),
(2), (4) Date: Apr. 20, 2005

(87) PCT Pub. No.: WO2004/032583

PCT Pub. Date: Apr. 15, 2004

(65) Prior Publication Data

US 2006/0007641 A1    Jan. 12, 2006

(30) Foreign Application Priority Data

Sep. 19, 2002    (DE)    ................... 102 43 637

(51) Int. Cl.
  *H05K 1/03*    (2006.01)
(52) U.S. Cl. ...................... 174/255; 174/254
(58) Field of Classification Search ........ 174/254, 174/255
See application file for complete search history.

(56) References Cited

U.S. PATENT DOCUMENTS

| | | | |
|---|---|---|---|
| 4,687,695 A | 8/1987 | Hamby | |
| 5,095,628 A | 3/1992 | McKenney et al. | |
| 5,100,492 A | 3/1992 | Kober et al. | |
| 5,142,448 A | 8/1992 | Kober et al. | |
| 5,144,534 A * | 9/1992 | Kober | 361/751 |
| 5,144,742 A | 9/1992 | Lucas et al. | |
| 5,262,594 A * | 11/1993 | Edwin et al. | 174/254 |
| 5,516,989 A * | 5/1996 | Uedo et al. | 174/254 |
| 6,818,989 B2 * | 11/2004 | Higuchi et al. | 257/738 |

FOREIGN PATENT DOCUMENTS

| | | |
|---|---|---|
| DE | 26 57 212 A1 | 6/1978 |
| DE | 33 02 857 A1 | 8/1984 |
| DE | 41 03 375 C1 | 6/1992 |
| DE | 41 31 935 A1 | 4/1993 |
| DE | 42 08 610 C1 | 5/1993 |
| DE | 42 06 746 C1 | 6/1993 |
| JP | 408134331 A * | 5/1996 |

OTHER PUBLICATIONS

Yoshida, H. et al., Development of LCD Modules for Automobiles, SID International Symposium Digest of Applications Papers; San Jose, Jun. 14-16, 1994; Santa Ana, SID, US; vol. 25, Jun. 14, 1994 pp. 27-30; XP000492842; ISSN: 0097-0966; p. 29, Left-Hand Column; Fig. 2.

* cited by examiner

Primary Examiner—Ishwar (I. B.) Patel
(74) Attorney, Agent, or Firm—David S. Safran

(57) ABSTRACT

A rigid-flexible circuit board with two rigid areas and one flexible area, with a rigid individual layer which is copper-clad on one side, with an adhesive medium and with a copper foil, the adhesive medium having recesses in the flexible area. The rigid-flexible circuit board can be produced especially easily and economically in that at least in the rigid area there is no flexible individual layer, especially no polyimide film, between the adhesive medium and the copper foil.

4 Claims, 1 Drawing Sheet

CIRCUIT BOARD WITH AT LEAST ONE RIGID AND AT LEAST ONE FLEXIBLE AREA AND PROCESS FOR PRODUCING RIGID-FLEXIBLE CIRCUIT BOARDS

BACKGROUND OF THE INVENTION

1. Field of Invention

The invention relates to a circuit board with at least one rigid area and at least one flexible area, with a rigid individual layer which is provided with printed conductors or is copper-clad on one or both sides, with an adhesive medium and with at least one copper foil, the adhesive medium having recesses in the flexible area. In addition, the invention relates to a process for producing such a rigid-flexible circuit board.

2. Description of Related Art

Printed electrical circuits have been used for decades, for example, in electrical devices and in motor vehicles for electronic control. Usually the circuit boards are rigid, and on the one hand, connect discrete components and highly integrated modules electrically to one another, and on the other hand, act as carriers of them. Circuit boards generally consist of one or more individual layers of glass fiber-reinforced, cured epoxy resin boards which are copper-clad on one or both sides for the formation of printed circuits or conductive patterns. For multilayer circuit boards, the individual planes or the printed circuits located on the individual layers are electrically connected to one another by plated holes in the circuit board.

In addition to rigid circuit boards, for about 30 years printed circuits have also been used which have rigid and flexible areas next to one another, so-called rigid-flexible circuit boards. By providing flexible areas, a large number of rigid circuit boards can be mechanically and electrically connected to one another in almost any desired three-dimensional arrangement without plug connectors or wiring. Moreover, the flexible areas make it possible to "fold" several rigid circuit board areas on top of one another such that a large circuit board area and thus also a host of discrete components located on the circuit boards can be accommodated in a relatively small space. The flexible areas normally consist of thin polyimide films which are likewise copper-clad on one side or both sides.

These rigid-flexible circuit boards are usually built from rigid and flexible individual layers which lie on top of one another, which extend over the entire circuit, and which are cemented to one another using an adhesive medium and pressed (EP 0 408 773 B1). There are inflexible (for example, glass fiber-reinforced epoxy resin) and flexible insulation carriers (for example, polyimide film) with copper cladding on one or both sides into which the printed conductors are etched. The shape of the rigid layers fixes the rigid part of the circuit boards. The flexible areas of the circuit boards are thus produced by removing a piece of the rigid layers in these areas in several process steps.

Both a liquid and a free-flowing cement which is applied for example by screen printing and also a film with adhesive properties can be used as the adhesive medium. In practice, in addition to pure adhesive films, especially so-called prepregs are used. A prepreg consists of a resin-impregnated glass fiber fabric, the resin not being completely polymerized. Under pressure and heat the resin liquefies and as it subsequently cures, it causes cementing to the bordering individual layers. In addition to these "normal" prepregs, there are also so-called no-flow prepregs in which flowability is reduced. In addition, so-called composite films can also be used as the adhesive medium; they consists of a flexible plastic film which is provided with adhesive on both sides. Within the framework of this invention, both cements and also the above described films—adhesive films, prepregs, no-flow prepregs and composite films—are to be included in the concept of adhesive medium.

EP 0 408 773 B1 discloses a process for producing rigid-flexible circuit boards in which before lamination of the individual layers into the overall circuit a piece is punched out of the rigid individual layer and is arranged according to the size and the desired position of the flexible area. This piece of the rigid individual layer is then inserted again into the individual layer to fit as closely as possible, the composite film in the area of the circuit board which is desired to be flexible having a recess so that the piece of the individual layer which had been punched out beforehand and inserted again is not cemented to the composite film in the following process steps. After lamination, the piece must be hermetically covered during the continuing production process in order to prevent plating on the flexible area and the transition to the rigid area. This covering is complicated and expensive, and in spite of great care damage can occur which leads to irreparable faults so that the affected circuit board can no longer be used.

Another process for producing rigid-flexible circuit boards is known from German Patent Application DE-AS 26 57 212. In this process, before pressing the individual layers, a groove (pre-groove) is made in the rigid outer layers on the side facing the flexible inside layer along the separating line of the rigid and flexible area of the circuit board, the groove depth being selected such that the outside of the rigid layers remains undamaged. The composite film using which the individual layers are cemented is cut out over the flexible area of the circuit so that cementing of the rigid outer layer over the future flexible area does not take place. In addition, separating films are often inserted which prevent flow of the composite films during pressing. After cementing the individual layers and after forming the conductive patterns on the outer layers, to produce the flexible area another groove (main groove) is then milled from the outer side of the rigid layer along the separating line of the rigid and flexible area of the circuit, this groove and the pre-groove which had already been made beforehand being aligned to one another so that the milled-out piece can be removed from the rigid individual layer.

Regardless of the manner in which the piece of the rigid individual layer is removed from the area of the circuit board which is desired to be flexible, the rigid-flexible circuit board known from EP 0 408 773 B1 which underlies the invention has the disadvantage that a relatively expensive flexible individual layer (polyimide film) is used over the entire surface and is needed actually only for the comparatively small flexible area. This leads to up to 75% or more of the expensive polyimide film being "wasted", depending on the shape of the circuit board.

Generally, rigid-flexible circuit boards which have an area of a few 10 $cm^2$ to a few 100 $cm^2$ are not produced separately, but a plurality of such circuit boards are located next to one another in a rigid plate which is generally called a panel. This panel typically has a square or rectangular surface with side lengths of for example 40 to 80 cm. Typically 20 to 30 completed circuit boards can be punched out of such a panel. The advantage of using these panels compared to using individual circuit boards in production is that the panels can be clamped more easily on a work table and several circuit boards can be produced at the same time with one clamping.

Since in these panels the flexible individual layer generally likewise has the dimensions of the panel, in this way the proportion of "wasted" expensive polyimide film is even increased since the polyimide film is also present in the intermediate areas between the individual circuit boards. These intermediate pieces are thrown away after the circuit boards are punched out of the panels.

For the aforementioned reasons it has been repeatedly suggested that the relatively expensive polyimide film which however has proven effective in practice be replaced by other, more economical flexible individual layers. German Patent DE 41 03 375 C1 discloses a rigid-flexible circuit board in which instead of a separate composite film and a separate polyimide film only one layer of a special flow material prepreg or a paper prepreg be used. This flow material prepreg or paper prepreg is placed directly on the entire rigid individual layer on the circuit side over the entire surface. Then likewise a copper foil is applied to the special prepreg over its entire area. To prevent the piece of the rigid individual layer which is to be removed from sticking to the special prepreg, a separating layer is applied to the side of the piece facing the prepreg. A similar rigid-flexible circuit board is known from German Patent DE 42 06 746 C1 in which, likewise, instead of an expensive flexible individual layer, a more economical thin prepreg is used which can also be bent after curing. In this circuit board, in the area which is desired to be flexible, an insulating film is also placed between the rigid individual layer and the prepreg before pressing.

German Patent Application DE 41 31 935 A1 describes a rigid-flexible circuit board which consists solely of an inherently rigid circuit board material so that expensive polyimide film has been completely abandoned. In this known circuit board which, however, withstands only a limited number of bending stresses, the rigid circuit board material in the area which is desired to be flexible has a much smaller thickness. This circuit board which can be produced relatively easily and economically is limited in its range of application, on the one hand, by the only limited flexibility, on the other hand, it is not suited for more complex circuits with several planes of printed conductors.

Finally, German Patent DE 40 03 345 C1 discloses a rigid-flexible circuit board which has a flexible polyimide film essentially only in the area which is desired to be flexible. Here, the polyimide film on the side facing the copper foil is provided with a flexible adhesive layer and on the side facing the rigid individual layer is provided with two thin adhesive strips which are located on the edge. The width and the location of the thin adhesive strips must be chosen such that the piece of the rigid individual layer which is to be removed is prevented from sticking to the adhesive strips. Since the thin adhesive strips often have a width of only 1 mm or less, the prefabrication of the polyimide film with the adhesive strips on one side and the adhesive layer on the other side is relatively time-consuming. Moreover, it is also necessary for the polyimide film which has been prepared in this way to be positioned very exactly on the rigid individual layer, since otherwise the piece of the rigid individual layer which is to be removed can likewise stick.

SUMMARY OF THE INVENTION

The object of this invention is thus to make available the initially described rigid-flexible circuit board and to devise a process for producing such a rigid-flexible circuit board, in which, on the one hand, the use of expensive flexible individual layers is for the most part abandoned, but which, on the other hand, can be produced as easily, quickly and economically as possible.

The aforementioned object, first of all, is achieved essentially in the initially described circuit board in that at least in the rigid area there is no flexible individual layer between the adhesive medium and the copper foil. Since, generally, most of the circuit board is formed by the rigid area, the measure in accordance with the invention results in that a large part of the expensive flexible individual layer can be omitted. If there is no polyimide film in the rigid area of the circuit board, this moreover has the advantage that special treatment, for example, by means of plasma cleaning, of the holes in the circuit board which are plated to connect the individual planes of a multilayer circuit board, can be abandoned.

Advantageously, in the circuit board of the invention, a flexible individual layer, especially a polyimide film, as the carrier for the copper film can be completely omitted. Polyimide films have the disadvantage that they absorb moisture so that when circuit boards are being produced and assembled several time-consuming drying processes are often necessary to prevent damage to the circuit board by delamination of the cemented areas or peeling of the printed conductors in a later working step. If polyimide film is completely eliminated, the drying processes which are otherwise necessary can be completely omitted.

According to one preferred embodiment of the circuit board in accordance with the invention, in the flexible area on the inner side of the copper foil, an insulating layer is applied directly to the copper foil. Basically, a host of materials can be used for the insulating layer. The insulating layer, on the one hand, must ensure insulation of the copper foil to the outside and of the individual printed conductors among one another, on the other hand, it must have sufficient flexibility so that the flexibility of the flexible area of the circuit board is not adversely affected to a significant degree by the insulating film. Finally, the insulating layer must have a composition such that it adheres directly to the copper foil. The insulating layer can be implemented especially easily by a flexible resist, especially a solder resist. These resists are very economical, thus absorb essentially no moisture, so that the drying processes can be omitted, and moreover they can be applied very quickly and easily at the desired location to the copper foil using a host of known processes.

According to a last advantageous configuration of the circuit board of the invention which will only be briefly addressed here, at least in the flexible area, another insulating layer is applied to the outer side of the copper foil. Likewise, the insulating layer can also be applied to the entire outer surface of the copper layer. In doing so, a flexible solder resist can in turn also be used as the insulating layer, for example. This second insulating layer on the outer side of the copper foil protects the conductive pattern which has been produced in the copper foil by etching and in particular mechanically stabilizes it in the flexible area. Another known cover film can also be used here instead of the solder resist.

The circuit board according to the invention is suited not only for producing two-layer, rigid-flexible circuit boards, but also for producing so-called multilayer circuit boards which have a host of layers with at least one conductive pattern in each layer. Therefore, the invention also relates to a multilayer circuit board with at least one rigid area and at least one flexible area, consisting of at least one above described circuit board as claimed of the invention, there being several rigid individual layers which are provided with printed conductors or which are copper-clad on one or both sides, and/or several copper foils which are provided with an insulating layer in the flexible area, and the rigid individual layers being cemented among one another and/or the copper foils being cemented among one another and/or the rigid individual layers and the copper foils being cemented to one another by means of an adhesive medium.

In the initially described process for producing rigid-flexible circuit boards, the aforementioned object is achieved according to a first alternative in that first an uncured insulating layer is applied to one side of the copper foil in the flexible area, that the insulating layer is cured to such an extent that the free surface loses its adhesive capacity, that afterwards the copper foil which has been pretreated in this way is cemented by means of the adhesive medium to the rigid individual layer, the side of the copper foil with the insulating layer facing the rigid individual layer, and that, then, in the flexible area of the circuit board, a piece of the rigid individual layer is removed. Because the insulating layer is partially cured after application to the copper foil, by which the free surface of the insulating layer loses its adhesive capacity, it is ensured that the piece of the rigid individual layer which is to be removed does not adhere to the insulating layer, by which the subsequent removal of the piece would be made difficult or entirely prevented.

According to one alternative configuration of the process in accordance with the invention, the copper foil is first cemented to the rigid individual layer by means of an adhesive medium, then in the flexible area of the circuit board, a piece of the rigid individual layer is removed and then an uncured insulating layer is applied to the inner side of the copper foil in the flexible area.

In the two above described alternative processes, the finished circuit board in the flexible area has simply a copper foil which is covered on the inside by an insulating layer. In the first alternative of the process of the invention, first, this insulating layer is applied to the copper foil before cementing and pressing of the circuit board, while in an alternative embodiment of the process according to the invention, first, the circuit board is cemented and pressed, then in the flexible area a piece of the rigid circuit board is removed and only then is the now accessible area of the copper foil provided with an insulating layer.

According to one advantageous configuration of the process of the invention the insulating layer which can be, for example, a flexible solder resist, is sprayed, rolled or printed onto the copper foil. All these techniques for applying the insulating layer to the copper foil can be carried out easily and economically, and by using the corresponding templates the insulating layer can be applied to the copper foil exactly at a defined position. In addition, with these methods, at the same time, a plurality of insulating layers can be applied to a large-area copper foil, so that in, one process step, the copper foil can be prepared for a complete panel, i.e., for a host of circuit boards.

In particular, there are a host of possibilities for embodying and developing the circuit board in accordance with the invention and the process of the invention. In this regard reference is made to the following description of a preferred embodiment in conjunction with the drawings.

DETAILED DESCRIPTION OF THE INVENTION

Figure 1:
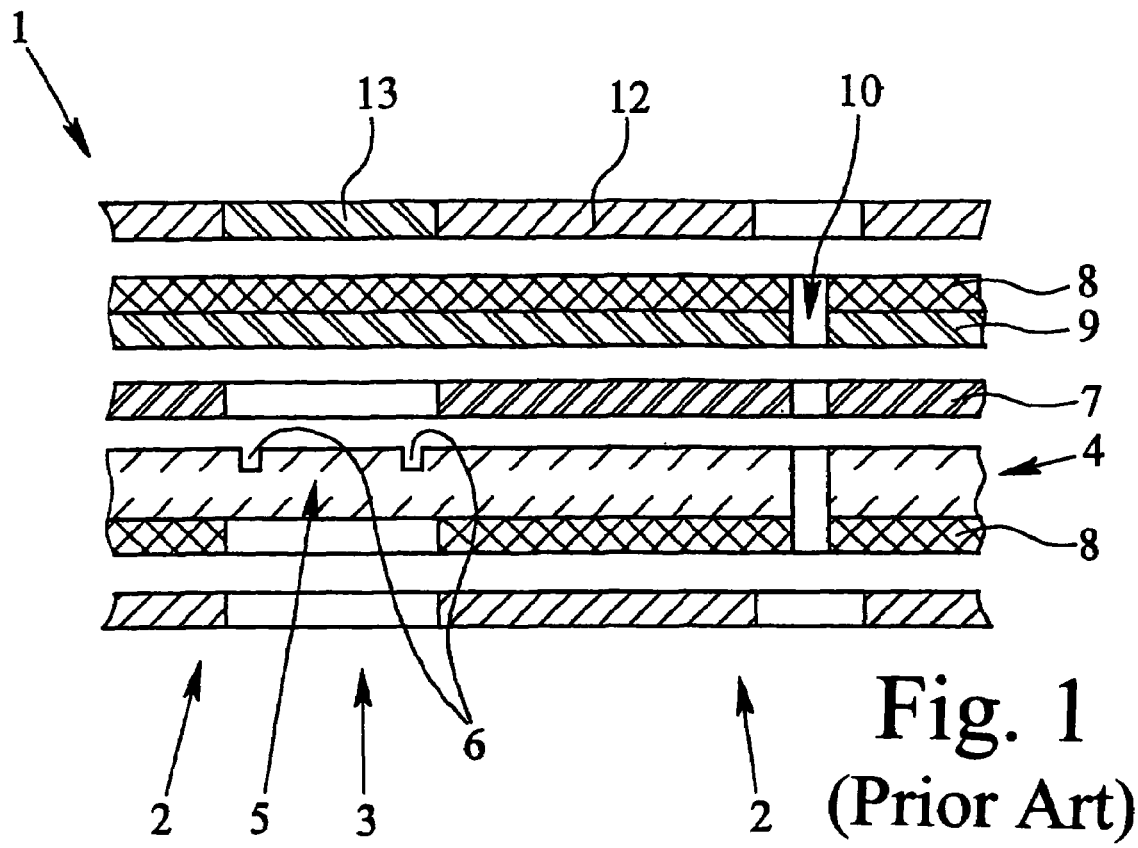
FIG. 1 shows a schematic section of a rigid-flexible circuit board known from the prior art and FIG. 2 shows a schematic section of one embodiment of a rigid-flexible circuit board in accordance with the invention.
Figure 2:
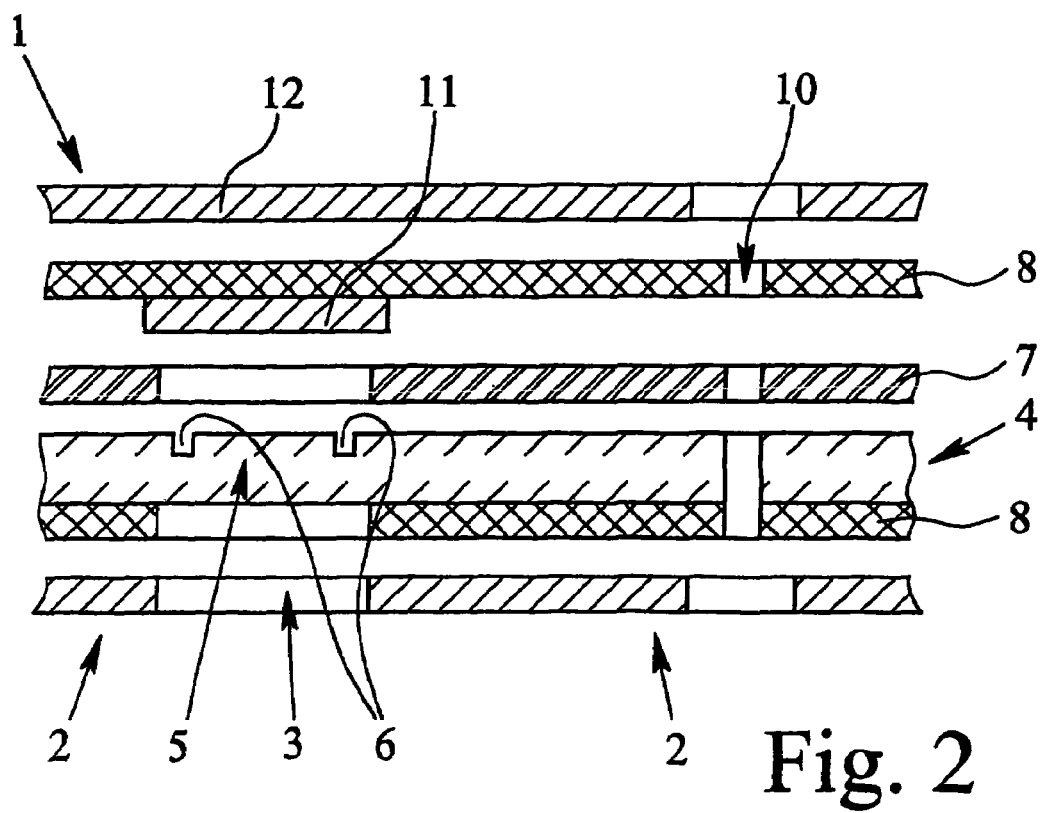

FIGS. 1 and 2 show a section through a known circuit board 1 (FIG. 1) and through a circuit board 1 in accordance with the invention (FIG. 2). The circuit board 1, which is shown only schematically in the figures and not yet cemented and pressed, will have in the fully assembled state two rigid areas 2 and one flexible area 3 which connects the two rigid areas 2 to one another. To achieve this flexible area 3, after pressing the circuit board 1, a piece 5 is milled out of the rigid individual layer 4. To do this, two pre-grooves 6 are formed in the rigid individual layer 4 on the inner side.

In addition to the rigid individual layer 4 which is copper-clad on one side in the embodiment shown, both the known circuit board 1 and also the circuit board 1 in accordance with the invention have an adhesive medium 7 and a copper foil 8. The adhesive medium 7 which is generally formed from a prepreg, in the flexible area 3 has a recess so that the piece 5 does not become cemented to the adhesive medium 7.

In the known circuit board 1 as shown in FIG. 1, moreover, there is another flexible individual layer 9 which is used as the carrier for the copper foil 8 and which is cemented to the rigid individual layer 4 by means of the adhesive medium 7 and is pressed. This flexible individual layer 9 is made mostly of a relatively expensive polyimide film which, on the one hand, has proven effective as a carrier of the copper foil 8 in millions of rigid-flexible circuit boards, but which, on the other hand, has other disadvantages in addition to the price which is high compared to the rigid individual layer 4. Due to the fact that the polyimide film absorbs moisture, both in the manufacture of the circuit board 1 and also during later assembly, several drying processes are often necessary to prevent damage to the circuit board 1, especially to the conductive patterns, by the evaporation of the absorbed liquid. Moreover, the use of a polyimide film as a flexible individual layer 9 in the rigid area 2 of the circuit board 1 also causes increased cost in the cleaning of the holes 10 made in the circuit board 1. The holes 10 are used to connect the individual conductive patterns in the different planes of the circuit board 1 to one another. For this reason, the holes 10 are plated, for which, however, special cleaning of the holes 10 is necessary beforehand and requires, for the most part, special treatment in the form of plasma cleaning when the polyimide film is drilled through.

In the circuit board of the invention which is shown in FIG. 2, conversely, a flexible individual layer 9, especially a polyimide film, has been completely eliminated. The copper foil 8 is attached directly to the rigid individual layer 4 by means of the adhesive medium 7. To prevent unallowable electrical contacts of the copper foil 8 with other components or short circuits between the individual printed conductors which have been formed on the copper foil 8, a thin insulating layer 11 is applied to the inner side, i.e., on the side facing the rigid individual layer 4, of the copper foil 8. To ensure sufficient insulation, the insulating layer 11 projects slightly over the surface of the piece 5 of the rigid individual layer 4 which is to be milled out.

In one preferred embodiment of the circuit board 1 according to the invention and of the process of the invention, for producing a rigid-flexible circuit board 1, the insulating layer 11 is applied to the copper foil 8 before the circuit board 1 is cemented and pressed. To do this, for example, a flexible plastic resist, especially a flexible solder resist, can be sprayed or imprinted onto the corresponding site on the copper foil 8. Using methods such as spraying, printing or rolling, the insulating layer 11 can be applied to the desired locations of a copper foil 8 very easily, promptly and accurately in terms of position. In doing so, at the same time, a host of insulating layers 11 can be applied to a copper foil 8 of a corresponding size so that in one process step a copper foil 8 can be prepared for several circuit boards 1.

According to one alternative—however not shown here—process for producing a rigid-flexible circuit board 1 in accordance with the invention, it is also possible to apply the insulating layer 11 only after cementing and pressing the circuit board 1 onto the inner side of the copper foil 8. In this process, before applying the insulating layer 11, first the piece 5 is removed from the rigid individual layer 4, so that the inner side of the copper foil 8 in the flexible area 3 of the circuit board 1 becomes accessible. In addition, it is also fundamentally possible to completely eliminate the use of an insulating layer 11 if the danger of unallowable electrical contacts or short circuits is precluded in some other way, for example, by potting a circuit board 1 which has been inserted into a housing.

The circuit board 1 according to the invention, moreover, has another insulating layer 12 which, after cementing and pressing of the copper foil 8 to the rigid individual layer 4, is applied to the outer side of the already structured copper foil 8. In the circuit board 1 of the invention as shown in FIG. 2, this insulating layer 12—in contrast to the known circuit board 1 as shown in FIG. 1—does not have a polyimide film as a partial cover film 13 either. The insulating layer 12 can in turn be formed from a flexible solder resist which is sprayed onto the copper foil 8 either only partially in the flexible area 3 of the circuit board 1 or over the entire surface, except for the holes 10.

The circuit board 1 in accordance with the invention, which is shown in FIG. 2, is thus characterized by especially simple, fast and economical production. First of all, money is saved by the relatively expensive polyimide film being completely eliminated. Moreover, application of the insulating layers 11 and 12 which are composed of, for example, of solder resist in a spraying or printing process is possible very easily, precisely and quickly.

As a result of the different coefficients of expansion of the rigid individual layer 4 and the polyimide film which is used in the prior art, in the circuit boards 1 which are used in the prior art, when temperature fluctuations occur, undesirable sagging of the circuit board 1 and a varied expansion in the thickness of the circuit board 1 between the rigid areas 2 and the flexible area 3 often occurs; this can lead to cracks in the printed conductors or in the plated holes 10. In the circuit board of the invention, conversely, the material of the insulating layer 11, 12 can be chosen such that the circuit board 1 is comprised essentially of materials with similar coefficients of expansion. As another advantage, this yields more uniform expansion behavior of the circuit board 1 so that the circuit board 1, under the action of heat, has only minimum allowable warping and bulging. In this way, the circuit board 1 as in accordance with the invention can be used especially effectively, for example, in automobiles, in which major temperature fluctuations often occur.

What is claimed is:

1. Circuit board, comprising:
   a rigid individual layer which is provided with printed conductors or is copper-clad on at least one side, said rigid individual layer having at least one rigid area and at least one flexible area,
   at least one copper foil,
   an adhesive medium directly connecting the at least one copper foil to the rigid individual layer, and
   wherein there is no flexible individual layer between the adhesive medium and the at least one copper foil in the rigid area of the rigid individual layer, and an insulating layer is affixed directly to an inner side of the copper foil in the at least one flexible area of the rigid individual layer,
   wherein the adhesive medium has an opening in alignment with the flexible area of the rigid individual layer,
   wherein, in the flexible area of the rigid individual layer, there is no flexible individual layer between the rigid individual layer and the copper foil, and
   wherein the insulating layer is a resist applied to the copper foil.

2. Circuit board as claimed in claim 1, wherein the resist is a flexible solder resist.

3. Circuit board as claimed in claim 1, wherein, at least in the flexible area, another insulating layer is applied to the outer side of the copper foil.

4. Circuit board as claimed in claim 3, the other insulating layer is a resist which has been applied to the copper foil.

* * * * *